(12) United States Patent
Aoki

(10) Patent No.: US 9,564,399 B2
(45) Date of Patent: Feb. 7, 2017

(54) SOLID STATE IMAGE SENSOR AND METHOD FOR MANUFACTURING THE SAME

(71) Applicant: CANON KABUSHIKI KAISHA, Tokyo (JP)

(72) Inventor: Takeshi Aoki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/749,954

(22) Filed: Jun. 25, 2015

(65) Prior Publication Data

US 2016/0005782 A1    Jan. 7, 2016

(30) Foreign Application Priority Data

Jul. 7, 2014  (JP) .................................. 2014-140000

(51) Int. Cl.
| | |
|---|---|
| *H01L 27/00* | (2006.01) |
| *H01L 23/532* | (2006.01) |
| *H01L 27/146* | (2006.01) |
| *H01L 23/552* | (2006.01) |

(52) U.S. Cl.
CPC ....... *H01L 23/53238* (2013.01); *H01L 23/552* (2013.01); *H01L 27/14623* (2013.01); *H01L 27/14636* (2013.01); *H01L 27/14685* (2013.01); *H01L 27/14698* (2013.01); *H01L 23/53228* (2013.01); *H01L 23/53295* (2013.01); *H01L 2924/0002* (2013.01)

(58) Field of Classification Search
CPC ................................................ H01L 27/14643
USPC ....................................... 257/432; 250/208.1
See application file for complete search history.

(56) References Cited

U.S. PATENT DOCUMENTS

| 8,184,189 B2 | 5/2012 | Tamura | |
|---|---|---|---|
| 2005/0007474 A1 | 1/2005 | Maeda | |
| 2010/0288911 A1* | 11/2010 | Mizuta | H01L 27/14632 250/208.1 |

(Continued)

FOREIGN PATENT DOCUMENTS

| JP | 2004-363375 A | 12/2004 |
|---|---|---|
| JP | 2009-290089 A | 12/2009 |

(Continued)

*Primary Examiner* — David Vu
*Assistant Examiner* — Brandon Fox
(74) *Attorney, Agent, or Firm* — Fitzpatrick, Cella, Harper & Scinto

(57) ABSTRACT

A method of manufacturing a solid state image sensor is provided. The method includes forming electrically conductive layer and an interlayer insulation film above a first region and a second region, performing an annealing process after forming the conductive layer and the interlayer insulation film, and forming a protective film above the interlayer insulation film and the electrically conductive layer. The electrically conductive layer includes a light shielding layer arranged above the second region. The interlayer insulation film includes a first portion located above the first region and a second portion located above the second region and below the light shielding layer. Before performing the annealing process, an average hydrogen concentration of the second portion is higher than an average hydrogen concentration of the first portion.

11 Claims, 9 Drawing Sheets

(56) References Cited

U.S. PATENT DOCUMENTS

| 2014/0054663 A1* | 2/2014 | Koizumi | H01L 27/14627 |
| | | | 257/292 |
| 2015/0221694 A1* | 8/2015 | Baba | H01L 27/14634 |
| | | | 257/443 |

FOREIGN PATENT DOCUMENTS

| JP | 2010-135509 A | 6/2010 |
| JP | 2012-023319 A | 2/2012 |

* cited by examiner

F I G. 12A
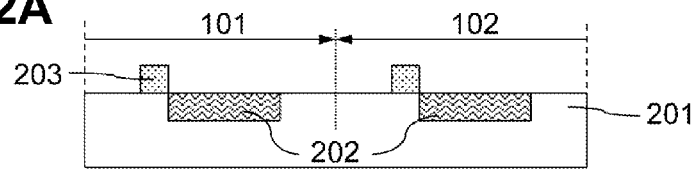
F I G. 12B
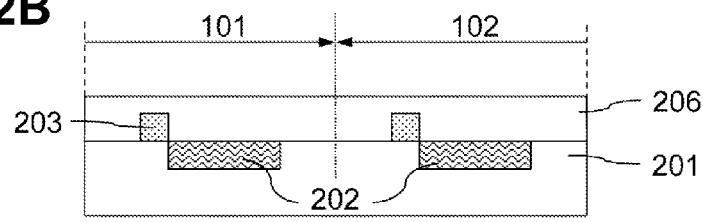
F I G. 12C
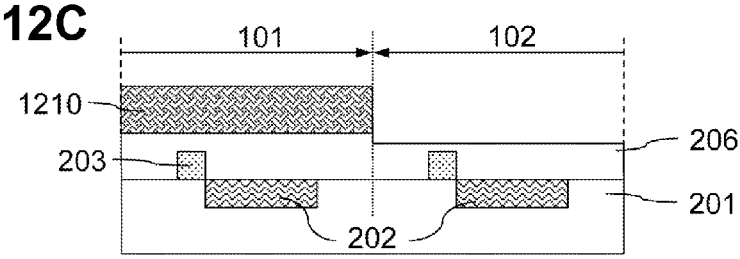
F I G. 12D
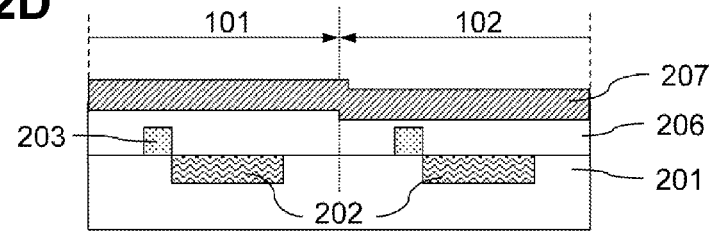
F I G. 12E
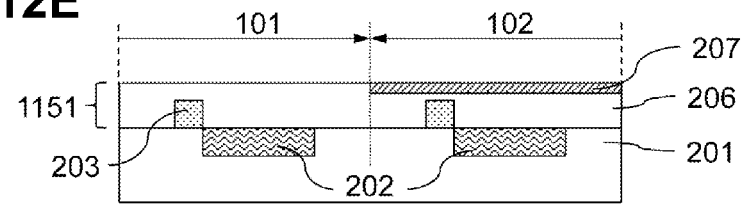

SOLID STATE IMAGE SENSOR AND METHOD FOR MANUFACTURING THE SAME

BACKGROUND OF THE INVENTION

Field of the Invention

The present invention relates to a solid state image sensor and a method for manufacturing the same.

Description of the Related Art

Japanese Patent Laid-open No. 2012-23319 discloses a manufacturing method aiming to uniformize the dark current that occurs in, of the effective pixel region of a solid state image sensor, a portion that is in the vicinity of the optical black pixel region and a central portion that is distant from the optical black pixel region. According to this method, the protective film is formed such that its portion located above the optical black pixel region has a greater thickness than its portion located above the effective pixel region. During sintering, at the portion of the effective pixel region in the vicinity of the optical black pixel region, some of the hydrogen supplied from the protective film to the substrate is absorbed into the light shielding layer of the optical black pixel region. At the portion of the effective pixel region in the vicinity of the optical black pixel region, the amount of hydrogen supplied from the protective film to the surface of the substrate is increased by forming the protective film such that its portion located above the optical black pixel region has a large thickness. This configuration uniformizes the amount of hydrogen supplied to the substrate surface at the portion in the vicinity of the optical black pixel region and the central portion distant from the optical black pixel region, of the effective pixel region. Consequently, this configuration reduces the variation of the dark current all over the effective pixel region.

SUMMARY OF THE INVENTION

The inventor has found that hydrogen discharged from the protective film is supplied uniformly to the entire effective pixel region, but the hydrogen is blocked by the light shielding layer and does not readily spread to the optical black pixel region located below the light shielding layer. For this reason, the dark current in the optical black pixel region after sintering is greater than the dark current in the effective pixel region, and in some cases it goes beyond the permissible range for correcting the black level output from the effective pixel region.

Some embodiments of the present invention provide a technology for reducing the variation of the dark current occurring in the effective pixel region and in the optical black pixel region, of the solid state image sensor.

According to some embodiments, a method for manufacturing a solid state image sensor, the method comprising: forming electrically conductive layer and an interlayer insulation film above a semiconductor substrate, the semiconductor substrate having a first region and a second region, photoelectric conversion elements being arranged in the first region and the second region; performing an annealing process after forming the conductive layer and the interlayer insulation film; and forming a protective film above the interlayer insulation film and the electrically conductive layer, wherein the electrically conductive layer includes a light shielding layer arranged above the second region, the interlayer insulation film includes a first portion that is located above the first region and a second portion that is located above the second region and below the light shielding layer, and before performing the annealing process, the second portion of the interlayer insulation film has an average hydrogen concentration that is higher than an average hydrogen concentration of the first portion of the interlayer insulation film, is provided.

According to some other embodiments, a solid state image sensor comprising: a semiconductor substrate having a first region and a second region, photoelectric conversion elements being arranged in the first region and the second region; electrically conductive layer; an interlayer insulation film; and a protective film on the interlayer insulation film and the electrically conductive layer, wherein the electrically conductive layer includes a light shielding layer above the second region, the interlayer insulation film includes a first portion that is located above the first region and a second portion that is located above the second region and below the light shielding layer, the first portion of the interlayer insulation film and the second portion of the interlayer insulation film each comprise insulation layer, and the first portion and the second portion are different from each other in layer configuration, is provided.

Further features of the present invention will become apparent from the following description of exemplary embodiments (with reference to the attached drawings).

BRIEF DESCRIPTION OF THE DRAWINGS

FIGS. 12A to 12E are process charts showing a method for manufacturing the solid state image sensor shown in FIG. 11.

DESCRIPTION OF THE EMBODIMENTS

The following describes specific embodiments of a method for manufacturing a solid state image sensor according to the present invention, with reference to the accompanying drawings. Solid state image sensors manufactured according to the following embodiments are so-called CMOS-type solid state image sensors. However, the present invention is not limited to the embodiments. For example, the present invention may be applied to CCD-type solid state image sensors.

Figure 1:
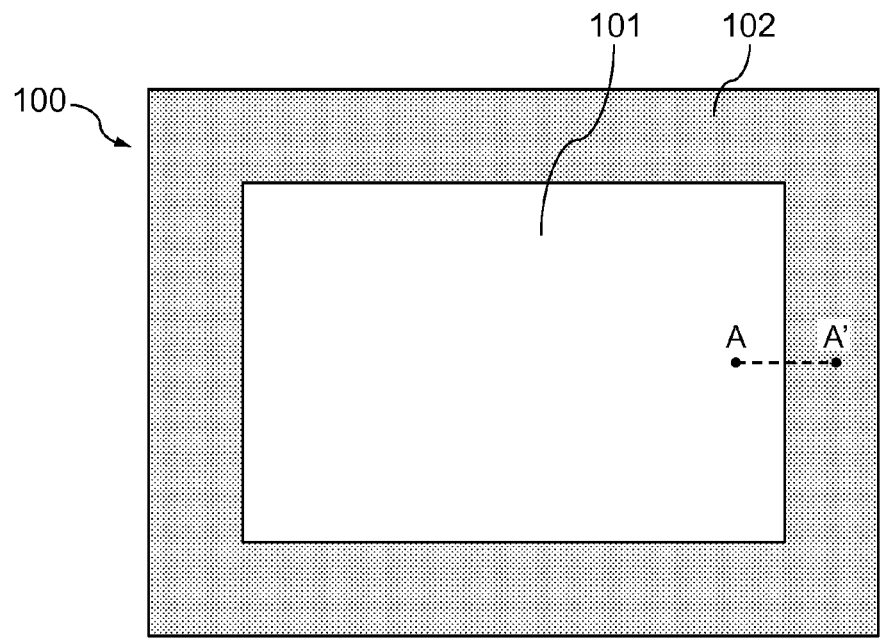
FIG. 1 is a plan view of a solid state image sensor according to the present invention.

With reference to FIGS. 1, 2, and 3A to 3D, a description is given of a method for manufacturing a solid state image sensor according to some embodiments of the present invention. FIG. 1 is a plan view schematically showing an example of a configuration of a solid state image sensor 100 according to a first embodiment of the present invention. In FIG. 1, the solid state image sensor 100 according to the present embodiment has an effective pixel region 101 at the center thereof, and an optical black pixel region 102 surrounding the effective pixel region 101. Furthermore, a peripheral circuit unit (not shown in the drawing) is provided to surround the optical black pixel region 102. In FIG. 1, the optical black pixel region 102 adjoins all the sides of the effective pixel region 101. However, the optical black pixel region 102 may be located to adjoin only some of the sides of the effective pixel region 101.

Figure 2:
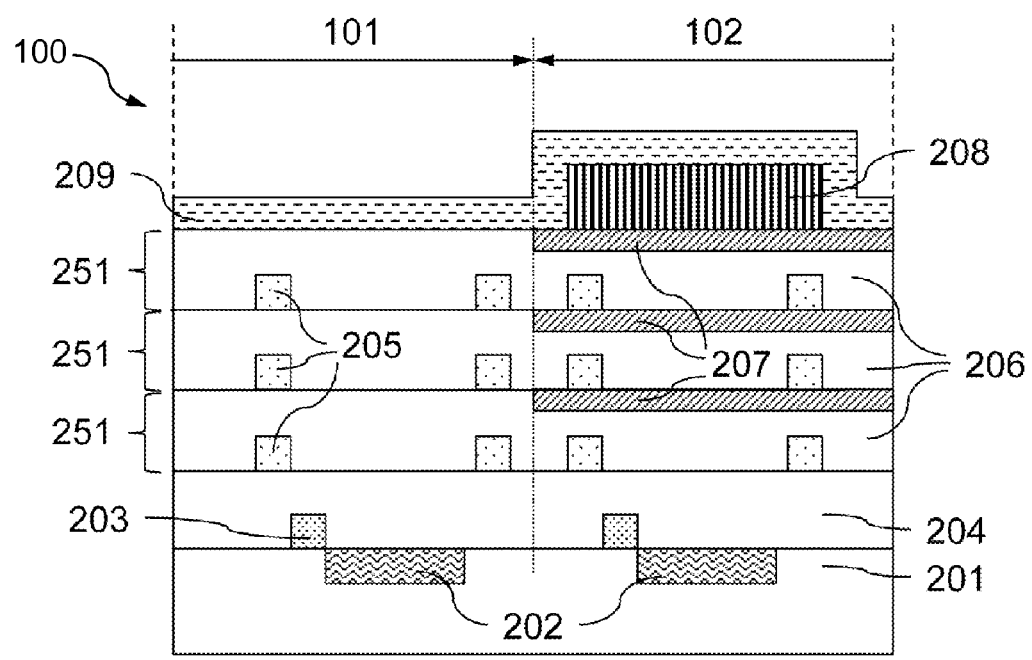
FIG. 2 is a cross-sectional view of a solid state image sensor according to an embodiment of the present invention.

FIG. 2 is a cross-sectional view along a dashed line A-A' in FIG. 1, which schematically shows an example of the configuration of the solid state image sensor 100. In the present embodiment, the solid state image sensor 100 is a CMOS-type device, and photodiodes 202, which are an example of photoelectric conversion elements, are formed on a semiconductor substrate 201. A gate electrode 203 of a charge transfer transistor for transferring signal charge generated in a photodiode 202 to a floating diffusion unit (not shown in the drawing) is provided at a position adjacent to the photodiode 202. By each of the photodiodes 202, the electric charge transferred to the floating diffusion unit is converted to voltage and is then output. The signal charge converted to voltage is amplified according to the voltage level, and is read out as an image signal for each pixel unit.

An interlayer insulation film 204 is formed on the gate electrodes 203. Three wiring layers 205 and three interlayer insulation films 251 for separating the wiring layers 205 from each other are formed above the interlayer insulation film 204. The lowermost wiring layer 205 and the gate electrodes 203 are separated by the interlayer insulation film 204. A light shielding layer 208 is formed on the uppermost interlayer insulation film 251. The interlayer insulation films 251 and the light shielding layer 208 are covered with a protective film 209.

The light shielding layer 208 is arranged above the optical black pixel region 102, but is not arranged above the effective pixel region 101. As a result, an electrically conductive layer including the three wiring layers 205 is arranged above the effective pixel region 101, and an electrically conductive layer including the three wiring layers 205 and one light shielding layer 208 is arranged above the optical black pixel region 102. Although not shown in the drawing, the wiring layers 205 are electrically connected with each other by a plug utilizing a metal material or the like. The wiring layers 205 and the light shielding layer 208 may also be electrically connected by a plug utilizing a metal material or the like. In the present embodiment, the light shielding layer 208 is arranged at a level higher than any of the three wiring layers 205 with reference to the surface of the semiconductor substrate 201, i.e., it is arranged as the uppermost layer. However, the light shielding layer 208 may be arranged at the same level as any of the three wiring layers 205. In this case, the wiring layer 205 and the light shielding layer 208 may be formed as a same electrically conductive pattern.

Each interlayer insulation film 251 includes an insulating layer 206 and an insulating layer 207. The insulating layers 206 are arranged above both the effective pixel region 101 and the optical black pixel region 102. Meanwhile, the insulating layers 207 are arranged only above the optical black pixel region 102, and are not arranged above the effective pixel region 101. As a result, each interlayer insulation film 251 has a single-layer configuration composed of the insulating layer 206 above the effective pixel region 101, and has a multi-layer configuration composed of the insulating layer 206 and the insulating layer 207 above the optical black pixel region 102. In the present embodiment, the insulating layers 207 are respectively located on the insulating layers 206. In FIG. 2, all three interlayer insulation films 251 have a multi-layer configuration. However, some of the interlayer insulation films 251 may have a single-layer configuration composed of the insulating layer 206.

Figure 3A:
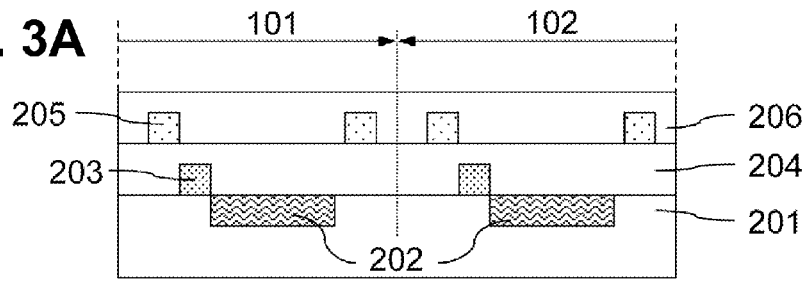
FIGS. 3A to 3D are process charts showing a method for manufacturing the solid state image sensor shown in FIG. 2.

Next, a description is given of a method for manufacturing the solid state image sensor 100 according to the present embodiment described above, with reference to FIGS. 3A to 3D. As shown in FIG. 3A, the pixel regions, namely the effective pixel region 101 and the optical black pixel region 102, are formed on the semiconductor substrate 201. The gate electrodes 203 and the interlayer insulation film 204 are formed on these pixel regions. Furthermore, the wiring layers 205 are formed on the interlayer insulation film 204. The wiring layers 205 are formed by utilizing a material containing aluminum as the principal component, for example. Since such a configuration can be formed by using an existing method, its detailed description is omitted here. Next, the insulating layer 206 is formed by CVD, for example. A silicon oxide film is used as the insulating layer 206, for example. The insulating layer 206 thus formed is uneven due to the wiring layers 205, and for this reason, the upper surface of the insulating layer 206 is planarized by CMP or the like.

Figure 3B:
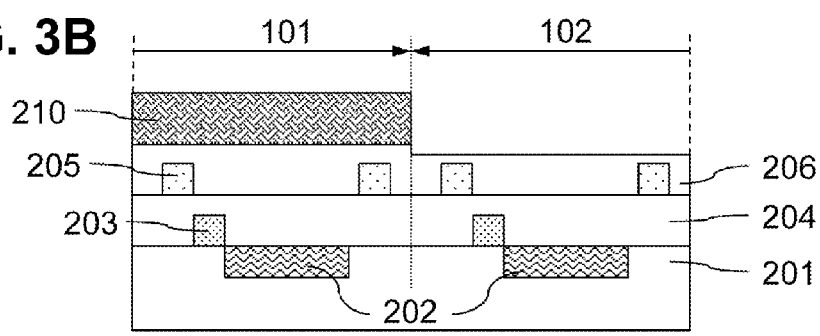

Next, as shown in FIG. 3B, a mask pattern 210 having an aperture above the optical black pixel region 102 is formed on the insulating layer 206. After that, the portion of the insulating layer 206 not covered with the mask pattern 210 is etched by dry etching for example, so that the film thickness of the portion is reduced. As shown in FIG. 3B, this etching may be ended before the upper surfaces of the wiring layers 205 are exposed.

Figure 3C:
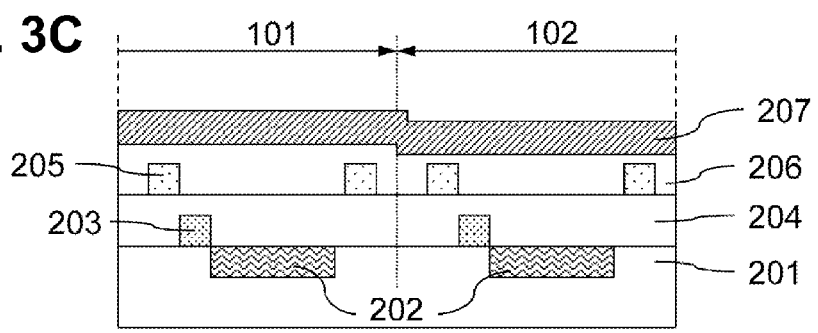

Subsequently, the mask pattern 210 is removed, and as shown in FIG. 3C, the insulating layer 207 having a higher hydrogen concentration than the insulating layer 206 is formed on the insulating layer 206 by CVD, for example. A silicon oxide film is used as the insulating layer 207, for example. In the present embodiment, the temperature at which the insulating layers 207 are formed is lower than the temperature at which the insulating layers 206 are formed. When forming a film utilizing a material containing hydrogen by CVD, the concentration of hydrogen contained in the film thus formed can be changed by changing the temperature at which the film is formed. The hydrogen concentration of the insulating layer 207 formed at a low temperature is higher than the hydrogen concentration of the insulating layer 206 formed at a high temperature.

Figure 3D:
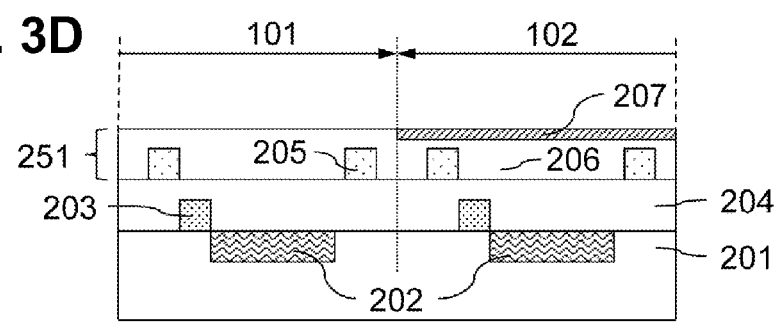

After the insulating layer 207 is formed, the upper surface of the insulating layer 207 is planarized by CMP or the like so that the insulating layer 207 remains on the optical black pixel region 102 and the insulating layer 207 is removed from the surface of the effective pixel region 101 as shown in FIG. 3D. By these processes, the interlayer insulation film 251 is formed so as to have the insulating layer 206 above the effective pixel region 101 and to have the insulating layer 206 and the insulating layer 207 above the optical black pixel region 102. After that, in the present embodiment, three interlayer insulation films 251 and three wiring layers 205 are formed by similar processes.

After that, the light shielding layer 208 containing, for example, aluminum as the principal component is formed on the optical black pixel region 102. A titanium film or the like is used as a barrier metal layer of the light shielding layer 208. Next, the protective film 209 is formed above the effective pixel region 101 and the optical black pixel region 102 by CVD, for example. A silicon nitride film is used as the protective film 209, for example. By the processes above, each constituent element of the solid state image sensor 100 shown in FIG. 2 is formed.

After the protective film 209 is formed, sintering is performed. Sintering is an annealing process applied in order to cause hydrogen contained in the interlayer insulation films 204 and 251 to diffuse, and thereby provides hydrogen to the surfaces of the photodiodes 202 each constituting a pixel. The hydrogen thus supplied accelerates hydrogen termination of the dangling bonds of the surfaces of the photodiodes 202. This treatment reduces the dark current occurring in the photodiodes 202.

Here, a description is given of advantageous effects of the present embodiment. During sintering, some of the hydrogen discharged from the interlayer insulation films to diffuse is absorbed into a metal film such as a titanium film, which constitutes the barrier metal layer of the light shielding layer 208 arranged above the optical black pixel region 102. Therefore, when the hydrogen concentration of the interlayer insulation films is uniform, the amount of hydrogen supplied to each of the photodiodes 202 of the optical black pixel region 102 is smaller than the amount of hydrogen supplied to each of the photodiodes 202 of the effective pixel region 101.

In the configuration disclosed in Japanese Patent Laid-open No. 2012-23319, hydrogen is supplied from the protective film that covers the effective pixel region and the optical black pixel region and that is arranged above the wiring layers and the light shielding layer. According to this configuration, hydrogen discharged from the protective film is blocked by the light shielding layer, and is prevented from diffusing to the optical black pixel region below the light shielding layer. Therefore, a larger amount of hydrogen diffuses to the effective pixel region than to the optical black pixel region. For this reason, the dark current in the optical black pixel region after the sintering is even greater than the dark current in the effective pixel region, and in some cases it goes beyond the appropriate range for correcting the black level output from the effective pixel region.

In the present embodiment, the hydrogen concentration of the insulating layers 207 is higher than the hydrogen concentration of the insulating layers 206. The insulating layers 207 are arranged only above the optical black pixel region 102. Therefore, of each of the interlayer insulation films 204 and 251, the portion located above the optical black pixel region 102 and below the light shielding layer 208 has a higher hydrogen concentration than the portion located above the effective pixel region 101.

In addition, since the insulating layers 207 are formed below the light shielding layer 208, the hydrogen that diffuses from the insulating layers 207 toward the semiconductor substrate 201 is unlikely to be blocked by the light shielding layer 208. Owing to these features, the variation in amount of hydrogen supplied to the surface of each photodiode 202 of the effective pixel region 101 and the optical black pixel region 102 can be reduced. As a result, the variation of the dark current occurring between the effective pixel region 101 and the optical black pixel region 102 can be reduced, which results in improvements in the performance of the solid state image sensor product so formed and the manufacturing yield. The average hydrogen concentration of the interlayer insulation films 251 is determined by considering the amount of hydrogen absorbed into the light shielding layer 208 and adjusting the thickness of the insulating layers 207.

When compared with the configuration disclosed in Japanese Patent Laid-open No. 2012-23319, the insulating layers in the present embodiment, which supply hydrogen, are arranged in the vicinity of the respective photodiodes 202. Therefore, hydrogen can be efficiently provided to the effective pixel region 101 and the optical black pixel region 102. Furthermore, also in the solid state image sensor 100 manufactured by the above-described processes, the hydrogen concentration of the insulating layers 207 may be higher than the hydrogen concentration of the insulating layers 206. This can be measured by, for example, time-of-flight secondary ion mass spectrometry.

Although the present embodiment shows an example in which each interlayer insulation film 251 has a single-layer configuration above the effective pixel region 101, and a double-layer configuration above the optical black pixel region 102, the present invention is not limited to such an embodiment. For example, each interlayer insulation film 251 may be configured to have three or more layers above each of the regions.

Figure 4:
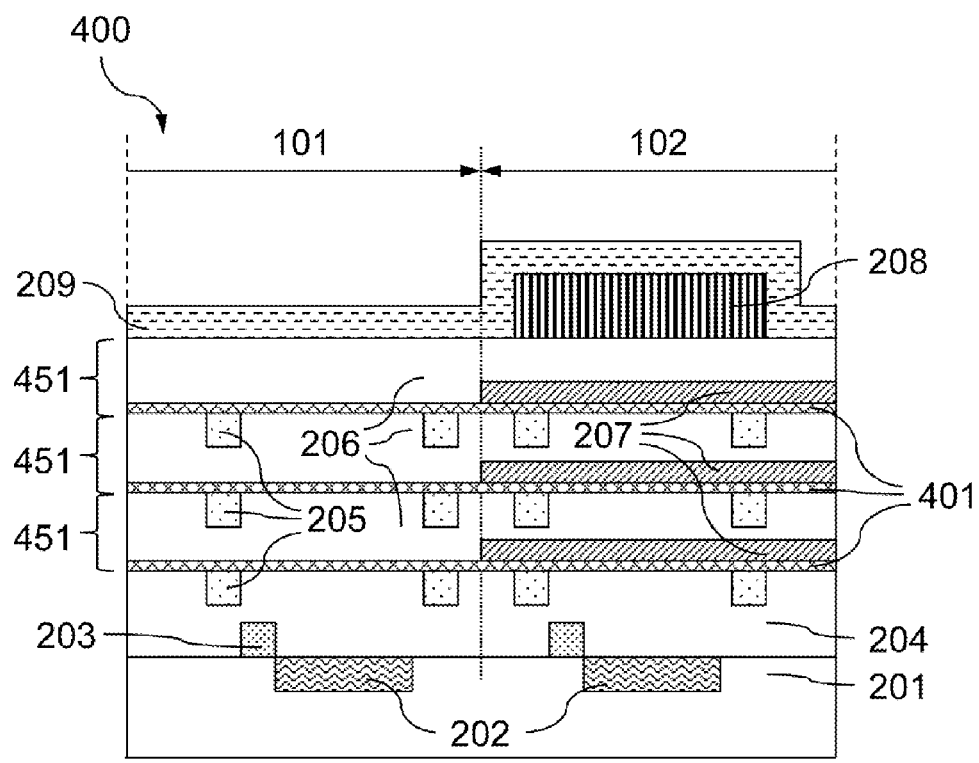
FIG. 4 is a cross-sectional view of a solid state image sensor according to an embodiment of the present invention.

With reference to FIGS. 4 and 5A to 5E, the following describes a configuration and a method for manufacturing of a solid state image sensor 400 according to a second embodiment of the present invention. A plan view of the solid state image sensor 400 may be the same as the plan view of the solid state image sensor 100 shown in FIG. 1. FIG. 4 is a cross-sectional view along the dashed line A-A' in FIG. 1, which schematically shows an example of the configuration of the solid state image sensor 400. The solid state image sensor 400 is different from the solid state image sensor 100 in having interlayer insulation films 451 instead of the interlayer insulation films 251, and may be the same in other points. Considering this, the following description focuses on the configuration and the manufacturing processes of the interlayer insulation films 451, and the same constituent elements as in the solid state image sensor 100 are not described redundantly.

In the present embodiment, three wiring layers 205 and three interlayer insulation films 451 for separating the wiring layers 205 from each other are formed above the interlayer insulation film 204. The light shielding layer 208 is formed on the interlayer insulation films 451. The interlayer insulation films 451 and the light shielding layer 208 are covered with the protective film 209.

In the present embodiment, the wiring layers 205 are wiring containing copper or the like as the principal component. Therefore, each interlayer insulation film 451 includes a copper anti-diffusion layer 401 on the wiring layer 205, and furthermore includes the insulating layer 206 and the insulating layer 207 on the copper anti-diffusion layer 401. The copper anti-diffusion layers 401 and the insulating layers 206 are arranged above both the effective pixel region 101 and the optical black pixel region 102. Meanwhile, the insulating layers 207 are arranged only above the optical black pixel region 102, and are not arranged above the effective pixel region 101. As a result, each interlayer insulation film 451 has a multi-layer configuration composed of the copper anti-diffusion layer 401 and the insulating layer 206 above the effective pixel region 101. Also, above the optical black pixel region 102, each interlayer insulation film 451 has a multi-layer configuration composed of the copper anti-diffusion layer 401, the insulating layer 206, and the insulating layer 207. In the present embodiment, the insulating layers 206 are respectively located on the insulating layers 207. In FIG. 4, all three interlayer insulation films 451 have a multi-layer configuration. However, it may be that only some of the interlayer insulation films 451 have a multi-layer configuration composed of the copper anti-diffusion layer 401 and the insulating layer 206, and some may have a single-layer configuration composed of the copper anti-diffusion layer 401.

Figure 5A:
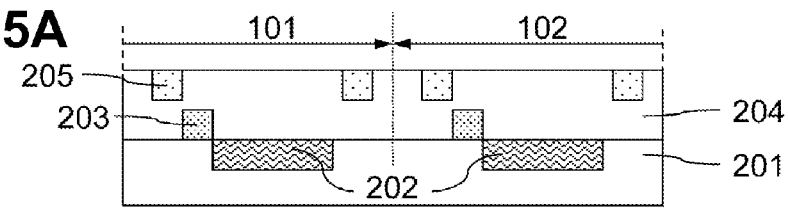
FIGS. 5A to 5E are process charts showing a method for manufacturing the solid state image sensor shown in FIG. 4.

Next, a description is given of a method for manufacturing the solid state image sensor 400 according to the present embodiment described above, with reference to FIGS. 5A to 5E. As shown in FIG. 5A, the pixel regions, namely the effective pixel region 101 and the optical black pixel region 102, are formed on the semiconductor substrate 201. The interlayer insulation film 204 is formed on these pixel regions. Furthermore, the wiring layers 205 are formed on the interlayer insulation film 204. In the present embodiment, the wiring layers 205 are formed by a Damascene process. The wiring layers 205 are formed by utilizing a material containing copper or the like as the principal component. Since such a configuration can be formed by using an existing method, its detailed description is omitted here.

Figure 5B:
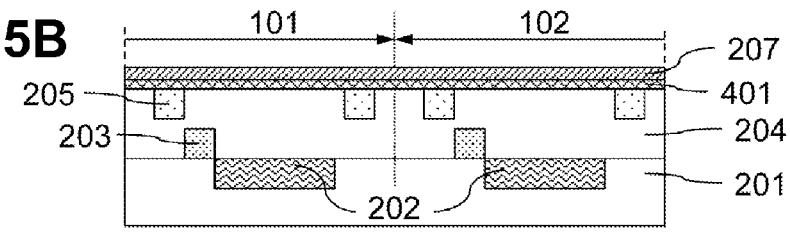

Next, as shown in FIG. 5B, the copper anti-diffusion layer 401 is formed by CVD for example, so as to cover the interlayer insulation film 204 and the wiring layers 205 above the effective pixel region 101 and the optical black pixel region 102. A silicon nitride film is used as the copper anti-diffusion layer 401, for example. On the copper anti-diffusion layer 401, the insulating layer 207 with a high concentration of hydrogen is formed by CVD, for example. A silicon oxide film is used as the insulating layer 207, for example.

Figure 5C:
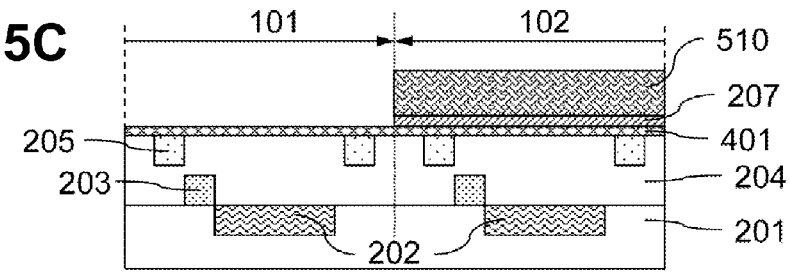
Figure 5D:
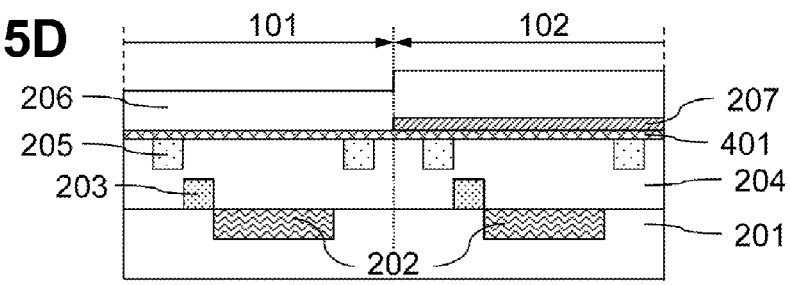

Next, as shown in FIG. 5C, a mask pattern 510 having an aperture above the effective pixel region 101 is formed such that insulating layer 207 remains on the optical black pixel region 102 and the insulating layer 207 is removed from the surface of the effective pixel region 101. After that, of the insulating layer 207 of the effective pixel region 101, the portion corresponding to the aperture of the mask pattern 510 is etched by dry etching for example, so that the portion of the insulating layer 207 is removed. After that, the mask pattern 510 is removed, and the insulating layer 206 is formed by CVD for example so as to cover the effective pixel region 101 and the optical black pixel region 102 as shown in FIG. 5D. A silicon oxide film is used as the insulating layer 206, for example.

Figure 5E:
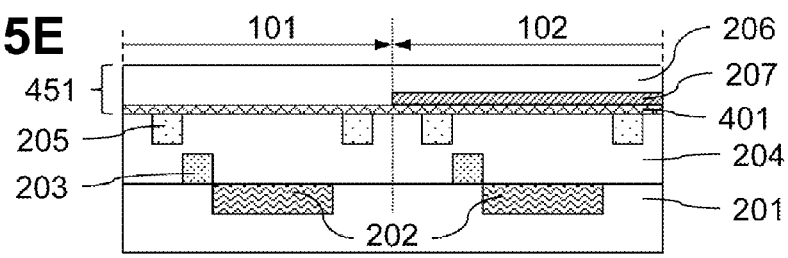

Next, as shown in FIG. 5E, the upper surface of the insulating layer 206 is planarized by CMP or the like, because the upper surface of the insulating layer 206 is uneven due to the insulating layer 207. By these processes, the interlayer insulation film 451 is formed so as to have the copper anti-diffusion layer 401 and the insulating layer 206 above the effective pixel region 101 and to have the copper anti-diffusion layer 401, the insulating layer 206, and the insulating layer 207 above the optical black pixel region 102. After that, in the present embodiment, three interlayer insulation films 451 and three wiring layers 205 are formed by similar processes.

After that, the light shielding layer 208 and the protective film 209 are formed in the same manner as in the method for manufacturing the solid state image sensor 100. By the processes above, each constituent element of the solid state image sensor 400 shown in FIG. 4 is formed.

After the protective film 209 is formed, sintering is performed. Sintering causes hydrogen contained in the interlayer insulation films 204 and 451 to diffuse, and thereby provides hydrogen to the surfaces of the photodiodes 202 each constituting a pixel.

In the present embodiment, the temperature at which the insulating layers 206 are formed is higher than the temperature at which the insulating layers 207 are formed. Therefore, the insulating layers 207 have a higher hydrogen concentration than the insulating layers 206. The insulating layers 207 are arranged only above the optical black pixel region 102. Therefore, of each of the interlayer insulation films 204 and 451, the portion located above the optical black pixel region 102 and below the light shielding layer 208 has a higher hydrogen concentration than the portion located above the effective pixel region 101. Therefore, the method for manufacturing the solid state image sensor 400 achieves the same advantageous effects as the method for manufacturing the solid state image sensor 100 described above.

Although the present embodiment shows an example in which each interlayer insulation film 451 has a double-layer configuration above the effective pixel region 101, and a triple-layer configuration above the optical black pixel region 102, the present invention is not limited to such an embodiment. For example, each interlayer insulation film 451 may be configured to have four or more layers above each of the regions.

Figure 6:
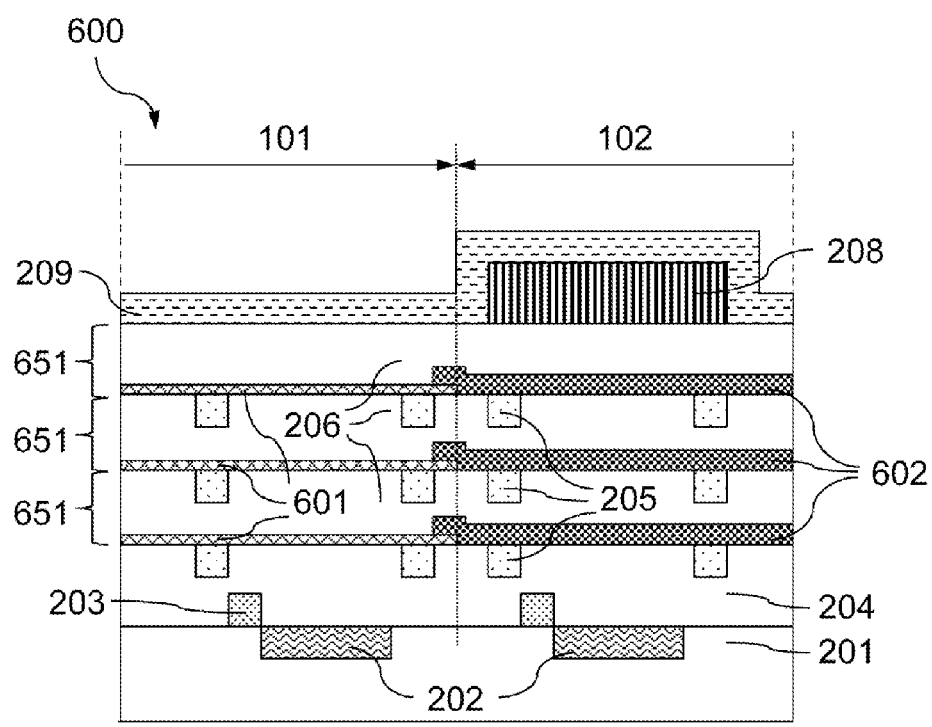
FIG. 6 is a cross-sectional view of a solid state image sensor according to an embodiment of the present invention.

With reference to FIGS. 6 and 7A to 7E, the following describes a configuration and a method for manufacturing of a solid state image sensor 600 according to a third embodiment of the present invention. A plan view of the solid state image sensor 600 may be the same as the plan view of the solid state image sensor 100 shown in FIG. 1. FIG. 6 is a cross-sectional view along the dashed line A-A' in FIG. 1, which schematically shows an example of the configuration of the solid state image sensor 600. The solid state image sensor 600 is different from the solid state image sensor 100 in having interlayer insulation films 651 instead of the interlayer insulation films 251, and may be the same in other points. Considering this, the following description focuses on the configuration and the manufacturing processes of the interlayer insulation films 651, and the same constituent elements as in the solid state image sensor 100 are not described redundantly.

In the present embodiment, three wiring layers 205 and three interlayer insulation films 651 for separating the wiring layers 205 from each other are formed above the interlayer insulation film 204. The light shielding layer 208 is formed on the interlayer insulation films 651. The interlayer insulation films 651 and the light shielding layer 208 are covered with the protective film 209.

In the present embodiment, the wiring layers 205 are wiring containing copper or the like as the principal component. Therefore, each interlayer insulation film 651 includes a copper anti-diffusion layer 601 and a copper anti-diffusion layer 602 on the wiring layer 205, and furthermore includes the insulating layer 206 on the copper anti-diffusion layers 601 and 602. The insulating layers 206 are arranged above both the effective pixel region 101 and the optical black pixel region 102. Meanwhile, the copper anti-diffusion layers 601 are arranged only above the effective pixel region 101, and are not arranged above the optical black pixel region 102. The copper anti-diffusion layers 602 are arranged above the optical black pixel region 102. As shown in FIG. 6, an end portion of each copper anti-diffusion layer 602 may extend across the boundary between the effective pixel region 101 and the optical black pixel region 102, and run upon an end portion of the copper anti-diffusion layer 601. The copper anti-diffusion layers 602 are at least not arranged at the positions to cover the photodiodes 202 of the effective pixel region 101. As a result, each interlayer insulation film 651 has a multi-layer configuration composed of the copper anti-diffusion layer 601 and the insulating layer 206, at least above the photodiodes 202 of the effective pixel region 101. Also, above the optical black pixel region 102, each interlayer insulation film 651 has a multi-layer configuration composed of the copper anti-diffusion layer 602 and the insulating layer 206. In FIG. 6, all three interlayer insulation films 651 have a multi-layer configuration. However, it may be that only some of the interlayer insulation films 651 have a multi-layer configuration composed of the copper anti-diffusion layer 601 and the copper anti-diffusion layer 602.

Figure 7A:
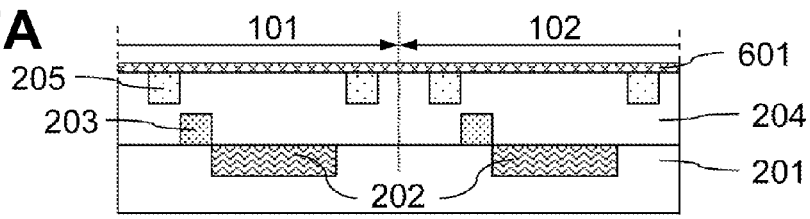
FIGS. 7A to 7E are process charts showing a method for manufacturing the solid state image sensor shown in FIG. 6.

Next, a description is given of a method for manufacturing the solid state image sensor 600 according to the present embodiment described above, with reference to FIGS. 7A to 7E. As shown in FIG. 7A, the pixel regions, namely the effective pixel region 101 and the optical black pixel region 102, are formed on the semiconductor substrate 201. The gate electrodes 203 and the interlayer insulation film 204 are formed on these pixel regions. Furthermore, the wiring layers 205 are formed on the interlayer insulation film 204. In the present embodiment, the wiring layers 205 are formed by a Damascene process. The wiring layers 205 are formed by utilizing a material containing copper or the like as the principal component. Since such a configuration can be formed by using an existing method, its detailed description is omitted here. After the wiring layers 205 are formed, the copper anti-diffusion layer 601 is formed by CVD for example, so as to cover the interlayer insulation film 204 and the wiring layers 205 above the effective pixel region 101 and the optical black pixel region 102. A silicon nitride film is used as the copper anti-diffusion layer 601, for example.

Figure 7B:
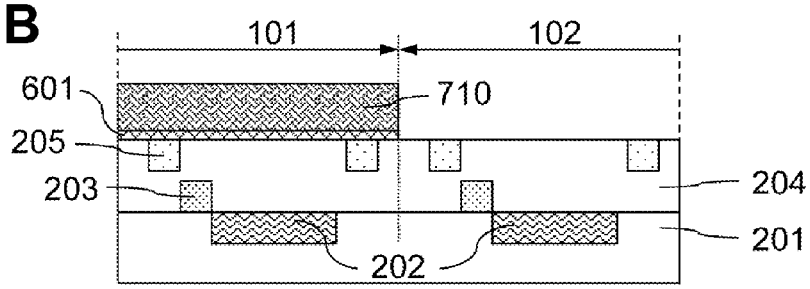

Next, as shown in FIG. 7B, a mask pattern 710 having an aperture above the optical black pixel region 102 is formed such that the copper anti-diffusion layer 601 remains on the effective pixel region 101 and the copper anti-diffusion layer 601 is removed from the surface of the optical black pixel region 102. After that, of the copper anti-diffusion layer 601 above the optical black pixel region 102, the portion corresponding to the aperture of the mask pattern 710 is etched by dry etching for example, so that the portion of the copper anti-diffusion layer 601 is removed.

Figure 7C:
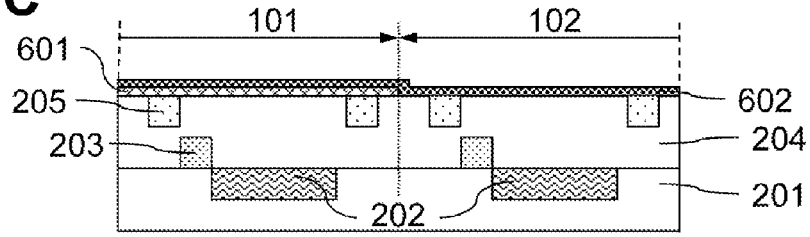

After the mask pattern 710 is removed, the effective pixel region 101 and the optical black pixel region 102 are covered with the copper anti-diffusion layer 602 as shown in FIG. 7C, by CVD for example. A silicon nitride film is used as the copper anti-diffusion layer 602, for example. In the present embodiment, the temperature at which the copper anti-diffusion layer 601 is formed is set higher than the temperature at which the copper anti-diffusion layer 602 is formed. As a result, the concentration of hydrogen contained in the copper anti-diffusion layer 601 will be higher than the concentration of hydrogen contained in the copper anti-diffusion layer 602.

Figure 7D:
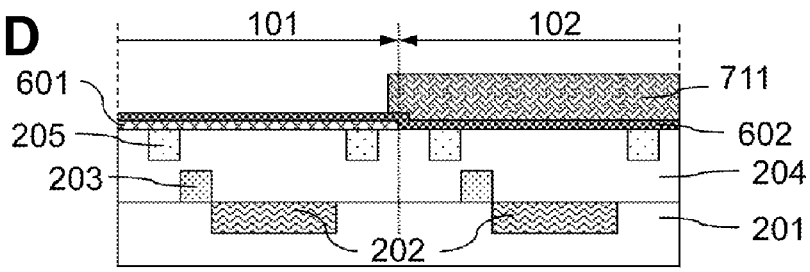

As shown in FIG. 7D, a mask pattern 711 having an aperture above the effective pixel region 101 is formed such that the copper anti-diffusion layer 602 remains on the optical black pixel region 102 and the copper anti-diffusion layer 602 is removed from the surface of the effective pixel region 101. After that, of the copper anti-diffusion layer 602 above the effective pixel region 101, the portion corresponding to the aperture of the mask pattern 711 is etched by dry etching for example, so that the portion of the copper anti-diffusion layer 602 is removed.

Figure 7E:
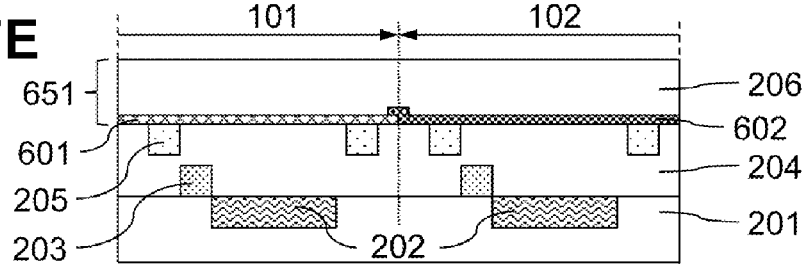

After the mask pattern 711 is removed, the respective surfaces of the effective pixel region 101 and the optical black pixel region 102 are entirely covered with the insulating layer 206 formed by CVD for example, and then the upper surface of the insulating layer 206 is planarized by CMP or the like. A silicon oxide film is used as the insulating layer 206, for example. A cross-sectional view in this stage is shown in FIG. 7E. By these processes, the interlayer insulation film 651 is formed so as to have at least the copper anti-diffusion layer 601 and the insulating layer 206 above the effective pixel region 101 and to have the copper anti-diffusion layer 602 and the insulating layer 206 above the optical black pixel region 102. After that, in the present embodiment, three interlayer insulation films 651 and three wiring layers 205 are formed by similar processes.

After that, the light shielding layer 208 and the protective film 209 are formed in the same manner as in the method for manufacturing the solid state image sensor 100. By the processes above, each constituent element of the solid state image sensor 600 shown in FIG. 6 is formed.

After the protective film 209 is formed, sintering is performed. Sintering causes hydrogen contained in the interlayer insulation films 204 and 651 to diffuse, and thereby provides hydrogen to the surfaces of the photodiodes 202 each constituting a pixel.

In the present embodiment, the copper anti-diffusion layer 602 has a higher hydrogen concentration than the copper anti-diffusion layer 601. The copper anti-diffusion layer 601 is arranged only above the effective pixel region 101, and the copper anti-diffusion layer 602 is arranged only above the optical black pixel region 102 and an end portion of the effective pixel region 101. Therefore, of each of the interlayer insulation films 204 and 651, the portion located above the optical black pixel region 102 and below the light shielding layer 208 has a higher hydrogen concentration than the portion located above the effective pixel region 101. Therefore, the method for manufacturing the solid state image sensor 600 achieves the same advantageous effects as the methods for manufacturing the solid state image sensors 100 and 400 described above.

Although the present embodiment shows an example in which each interlayer insulation film 651 has a double-layer configuration above the effective pixel region 101 and above the optical black pixel region 102, the present invention is not limited to such an embodiment. For example, each interlayer insulation film 651 may be configured to have three or more layers above each of the regions. In addition, for example an end portion of each copper anti-diffusion layer 601 may be configured so as not to cover the photodiodes 202 of the optical black pixel region 102, and run upon an end portion of the copper anti-diffusion layer 602 near the boundary between the effective pixel region 101 and the optical black pixel region 102.

Figure 8:
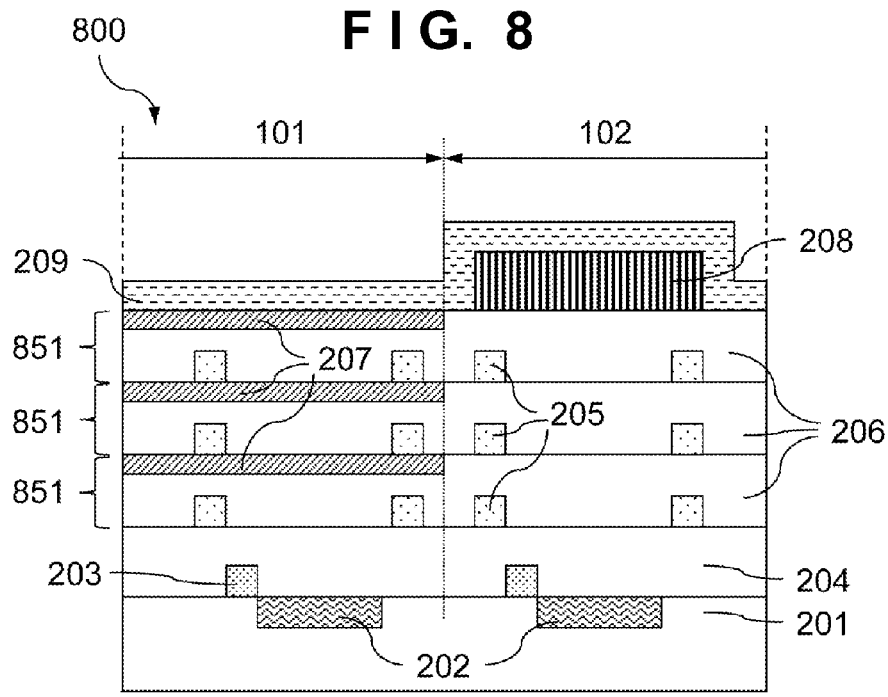
FIG. 8 is a cross-sectional view of a solid state image sensor according to an embodiment of the present invention.

With reference to FIG. 8, the following describes a configuration and a method for manufacturing of a solid state image sensor 800 according to a fourth embodiment of the present invention. A plan view of the solid state image sensor 800 may be the same as the plan view of the solid state image sensor 100 shown in FIG. 1. FIG. 8 is a cross-sectional view along the dashed line A-A' in FIG. 1, which schematically shows an example of the configuration of the solid state image sensor 800. The solid state image sensor 800 is different from the solid state image sensor 100 in having interlayer insulation films 851 instead of the interlayer insulation films 251, and may be the same in other points. Considering this, the following description focuses on the configuration of the interlayer insulation films 851, and the same constituent elements as in the solid state image sensor 100 are not described redundantly.

In the present embodiment, three wiring layers 205 and three interlayer insulation films 851 for separating the wiring layers 205 from each other are formed above the interlayer insulation film 204. The light shielding layer 208 is formed on the interlayer insulation films 851. The interlayer insulation films 851 and the light shielding layer 208 are covered with the protective film 209. In the present embodiment, each interlayer insulation film 851 includes an insulating layer 206 and an insulating layer 207. The insulating layers 206 are arranged above both the effective pixel region 101 and the optical black pixel region 102. Meanwhile, the insulating layers 207 are arranged only above the effective pixel region 101, and are not arranged above the optical black pixel region 102. As a result, each interlayer insulation film 851 has a multi-layer configuration composed of the insulating layer 206 and the insulating layer 207 above the effective pixel region 101, and has a single-layer configuration composed of the insulating layer 206 above the optical black pixel region 102. In the present embodiment, the insulating layers 207 are respectively located on the insulating layers 206. In FIG. 8, all three interlayer insulation films 851 have a multi-layer configuration. However, some of the interlayer insulation films 851 may have a single-layer configuration composed of the insulating layer 206.

Next, a description is given of a method for manufacturing the solid state image sensor 800. Although this method is similar to the method for manufacturing the solid state image sensor 100 up until the process of forming the light shielding layer 208 is completed, it is different in locations where the insulating layers 207 are formed. In the method for manufacturing the solid state image sensor 100, the insulating layers 207 are formed above the optical black pixel region 102, whereas in the method of manufacturing the solid state image sensor 800, the insulating layers 207 are formed above the effective pixel region 101. Since the insulating layers 207 are formed at a lower temperature than the insulating layers 206, they have a higher hydrogen concentration than the insulating layers 206. After that, sintering is performed, and then the protective film 209 is formed.

In the present embodiment, sintering is performed before the protective film 209 is formed, in order to improve the reliability of the wiring. Sintering causes hydrogen contained in the interlayer insulation films 204 and 851 to diffuse, and thereby provides hydrogen to the surfaces of the photodiodes 202 each constituting a pixel. Of each of the interlayer insulation films 204 and 851, hydrogen contained in the portion located above the optical black pixel region 102 is unlikely to be discharged upward during the sintering, because it is blocked by the light shielding layer 208. Meanwhile, the light shielding layer 208 is not formed above the effective pixel region 101, and the protective film 209 has not been formed when the sintering is performed. Therefore, of each of the interlayer insulation films 204 and 851, hydrogen contained in the portion located above the effective pixel region 101 diffuses without being blocked, and is readily discharged upward from the interlayer insulation films 851. For this reason, when the hydrogen concentration of the interlayer insulation films 204 and 851 is uniform, the amount of hydrogen supplied to the effective pixel region 101 is smaller than the amount of hydrogen supplied to the optical black pixel region 102.

In the present embodiment, at the time before the sintering has been performed, the hydrogen concentration of the insulating layers 207 is higher than the hydrogen concentration of the insulating layers 206. The insulating layers 207 are formed only above the effective pixel region 101. Therefore, of each of the interlayer insulation films 204 and 851, the portion located above the effective pixel region 101 has a higher hydrogen concentration than the portion located above the optical black pixel region 102 and below the light shielding layer 208.

The average hydrogen concentration of the interlayer insulation films 851 is determined by considering the amount of hydrogen discharged from above the effective pixel region 101 during the sintering applied before the protective film 209 is formed and adjusting the thickness of the insulating layers 207 having a high concentration of hydrogen. Thus, the variation in amount of hydrogen supplied to the surface of each photodiode 202 of the effective pixel region 101 and the optical black pixel region 102 can be reduced. As a result, the variation of the dark current occurring between the effective pixel region 101 and the optical black pixel region 102 can be reduced, which results in improvements in the performance of the solid state image sensor product so formed and the manufacturing yield.

Although the present embodiment shows an example in which each interlayer insulation film 851 has a double-layer configuration above the effective pixel region 101, and a single-layer configuration above the optical black pixel region 102, the present invention is not limited to such an embodiment. For example, each interlayer insulation film 851 may be configured to have three or more layers above each of the regions.

Figure 9:
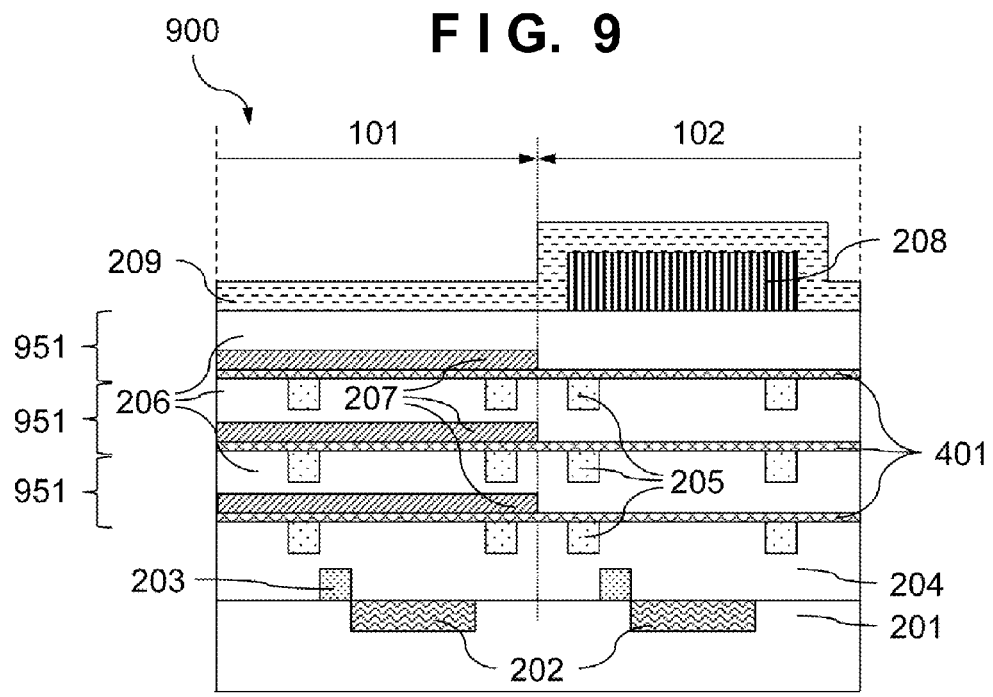
FIG. 9 is a cross-sectional view of a solid state image sensor according to an embodiment of the present invention.

With reference to FIG. 9, the following describes a configuration and a method for manufacturing of a solid state image sensor 900 according to a fifth embodiment of the present invention. A plan view of the solid state image sensor 900 may be the same as the plan view of the solid state image sensor 100 shown in FIG. 1. FIG. 9 is a cross-sectional view along the dashed line A-A' in FIG. 1, which schematically shows an example of the configuration of the solid state image sensor 900. The solid state image sensor 900 is different from the solid state image sensor 100 in having interlayer insulation films 951 instead of the interlayer insulation films 251, and may be the same in other points. Considering this, the following description focuses on the configuration of the interlayer insulation films 951, and the same constituent elements as in the solid state image sensor 100 are not described redundantly.

In the present embodiment, each interlayer insulation film 951 includes a copper anti-diffusion layer 401 on the wiring layer 205, and furthermore includes the insulating layer 206 and the insulating layer 207 on the copper anti-diffusion layer 401. The copper anti-diffusion layers 401 and the insulating layers 206 are arranged above both the effective pixel region 101 and the optical black pixel region 102. Meanwhile, the insulating layers 207 are arranged only above the effective pixel region 101, and are not arranged above the optical black pixel region 102. As a result, each interlayer insulation film 951 has a multi-layer configuration composed of the copper anti-diffusion layer 401, the insulating layer 206, and the insulating layer 207 above the effective pixel region 101. Also, above the optical black pixel region 102, each interlayer insulation film 951 has a multi-layer configuration composed of the copper anti-diffusion layer 401 and the insulating layer 206. In the present embodiment, the insulating layers 206 are respectively located on the insulating layers 207. In FIG. 9, all three interlayer insulation films 951 have a multi-layer configuration. However, it may be that only some of the interlayer insulation films 951 have a multi-layer configuration composed of the copper anti-diffusion layer 401 and the insulating layer 206.

Next, a description is given of a method for manufacturing the solid state image sensor 900. Although this method is similar to the method for manufacturing the solid state image sensor 400 up until the process of forming the light shielding layer 208 is completed, it is different in locations where the insulating layers 207 are formed. In the method for manufacturing the solid state image sensor 400, the insulating layers 207 are formed above the optical black pixel region 102, whereas in the method of manufacturing the solid state image sensor 900, the insulating layers 207 are formed above the effective pixel region 101. Since the insulating layers 207 are formed at a lower temperature than the insulating layers 206, they have a higher hydrogen concentration than the insulating layers 206. After that, sintering is performed, and then the protective film 209 is formed.

In the present embodiment, sintering is performed before the protective film 209 is formed, in order to improve the reliability of the wiring as in the fourth embodiment. Sintering causes hydrogen contained in the interlayer insulation films 204 and 951 to diffuse, and thereby provides hydrogen to the surfaces of the photodiodes 202 each constituting a pixel.

In the present embodiment, the hydrogen concentration of the insulating layers 207 is higher than the hydrogen concentration of the insulating layers 206. The insulating layers 207 are formed only above the effective pixel region 101. Therefore, of each of the interlayer insulation films 204 and 951, the portion located above the effective pixel region 101 has a higher hydrogen concentration than the portion located above the optical black pixel region 102 and below the light shielding layer 208. Therefore, the method for manufacturing the solid state image sensor 900 achieves the same advantageous effects as the method for manufacturing the solid state image sensor 800 described in the fourth embodiment.

Although the present embodiment shows an example in which each interlayer insulation film 951 has a triple-layer configuration above the effective pixel region 101, and a double-layer configuration above the optical black pixel region 102, the present invention is not limited to such an embodiment. For example, each interlayer insulation film 951 may be configured to have four or more layers above each of the regions.

Figure 10:
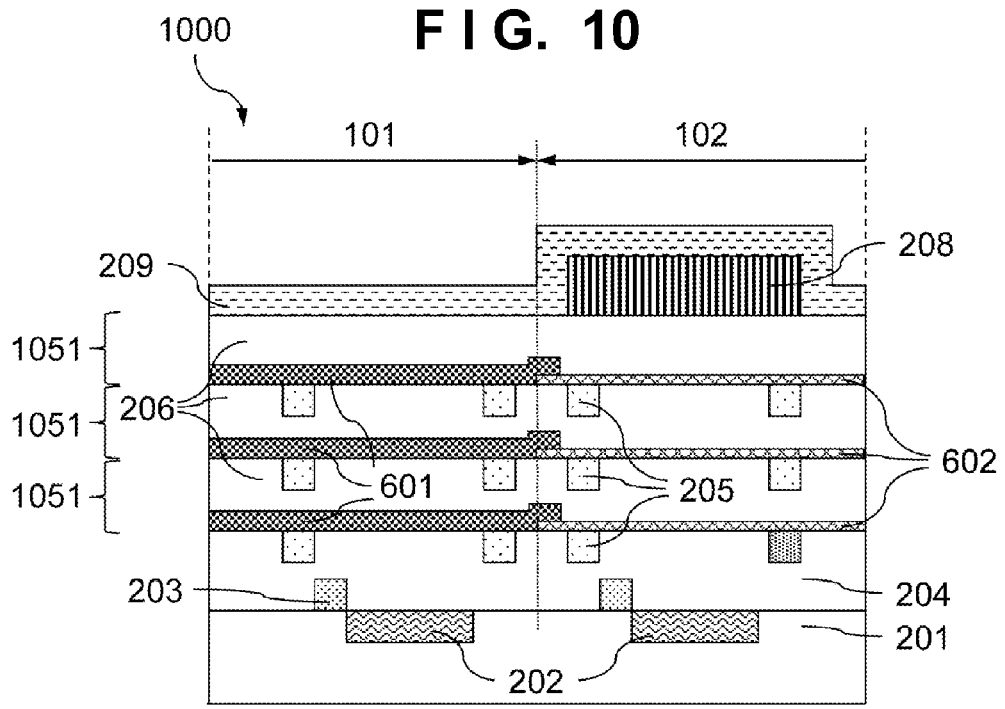
FIG. 10 is a cross-sectional view of a solid state image sensor according to an embodiment of the present invention.

With reference to FIG. 10, the following describes a configuration and a method for manufacturing of a solid state image sensor 1000 according to a sixth embodiment of the present invention. A plan view of the solid state image sensor 1000 may be the same as the plan view of the solid state image sensor 100 shown in FIG. 1. FIG. 10 is a cross-sectional view along the dashed line A-A' in FIG. 1, which schematically shows an example of the configuration of the solid state image sensor 1000. The solid state image sensor 1000 is different from the solid state image sensor 100 in having interlayer insulation films 1051 instead of the interlayer insulation films 251, and may be the same in other points. Considering this, the following description focuses on the configuration of the interlayer insulation films 1051, and the same constituent elements as in the solid state image sensor 100 are not described redundantly.

In the present embodiment, each interlayer insulation film 1051 includes a copper anti-diffusion layer 601 and a copper anti-diffusion layer 602 on the wiring layer 205, and furthermore includes the insulating layer 206 on the copper anti-diffusion layers. The insulating layers 206 are arranged above both the effective pixel region 101 and the optical black pixel region 102. Meanwhile, the copper anti-diffusion layers 602 are arranged above the effective pixel region 101. Also, the copper anti-diffusion layers 601 are arranged only above the optical black pixel region 102, and are not arranged above the effective pixel region 101. As shown in FIG. 10, an end portion of each copper anti-diffusion layer 602 may extend across the boundary between the effective pixel region 101 and the optical black pixel region 102, and run upon an end portion of the copper anti-diffusion layer 601. The copper anti-diffusion layers 602 are at least not arranged at the positions to cover the photodiodes 202 of the optical black pixel region 102. As a result, each interlayer insulation film 1051 has a multi-layer configuration composed of the copper anti-diffusion layer 602 and the insulating layer 206, at least above the photodiodes 202 of the effective pixel region 101. Also, above the optical black pixel region 102, each interlayer insulation film 1051 has a multi-layer configuration composed of the copper anti-diffusion layer 601 and the insulating layer 206. In FIG. 10, all three interlayer insulation films 1051 have a multi-layer configuration. However, it may be that only some of the interlayer insulation films 1051 have a multi-layer configuration composed of the copper anti-diffusion layer 601 and the copper anti-diffusion layer 602.

Next, a description is given of a method for manufacturing the solid state image sensor 1000. Although this method is similar to the method for manufacturing the solid state image sensor 600 up until the process of forming the light shielding layer 208 is completed, it is different in locations where the copper anti-diffusion layers 601 and 602 are formed. In the method for manufacturing the solid state image sensor 1000, the copper anti-diffusion layers 601 are formed above the effective pixel region 101, and the copper anti-diffusion layers 602 are formed above the optical black pixel region 102. An end portion of each copper anti-diffusion layer 601 may run upon an end portion of the copper anti-diffusion layer 602 near the boundary between the effective pixel region 101 and the optical black pixel region 102. The copper anti-diffusion layers 602 are formed at a lower temperature than the copper anti-diffusion layers 601, and have a higher hydrogen concentration than the copper anti-diffusion layers 601. After that, sintering is performed, and then the protective film 209 is formed.

In the present embodiment, sintering is performed before the protective film 209 is formed, in order to improve the reliability of the wiring as in the fourth and fifth embodiments. Sintering causes hydrogen contained in the interlayer insulation films 204 and 1051 to diffuse, and thereby provides hydrogen to the surfaces of the photodiodes 202 each constituting a pixel.

In the present embodiment, the hydrogen concentration of the copper anti-diffusion layers 602 is higher than the hydrogen concentration of the copper anti-diffusion layers 601. The copper anti-diffusion layers 602 are arranged only above the effective pixel region 101. Therefore, of each of the interlayer insulation films 204 and 1051, the portion located above the effective pixel region 101 has a higher hydrogen concentration than the portion located above the optical black pixel region 102 and below the light shielding layer 208. Therefore, the method for manufacturing the solid state image sensor 1000 achieves the same advantageous effects as the method for manufacturing the solid state image sensors 800 and 900 described above.

Although the present embodiment shows an example in which each interlayer insulation film 1051 has a double-layer configuration above the effective pixel region 101 and above the optical black pixel region 102, the present invention is not limited to such an embodiment. For example, each interlayer insulation film 1051 may be configured to have three or more layers above each of the regions. In addition, for example an end portion of each copper anti-diffusion layer 601 may be configured so as not to cover the photodiodes 202 of the effective pixel region 101, and run upon an end portion of the copper anti-diffusion layer 602 near the boundary between the effective pixel region 101 and the optical black pixel region 102.

Figure 11:
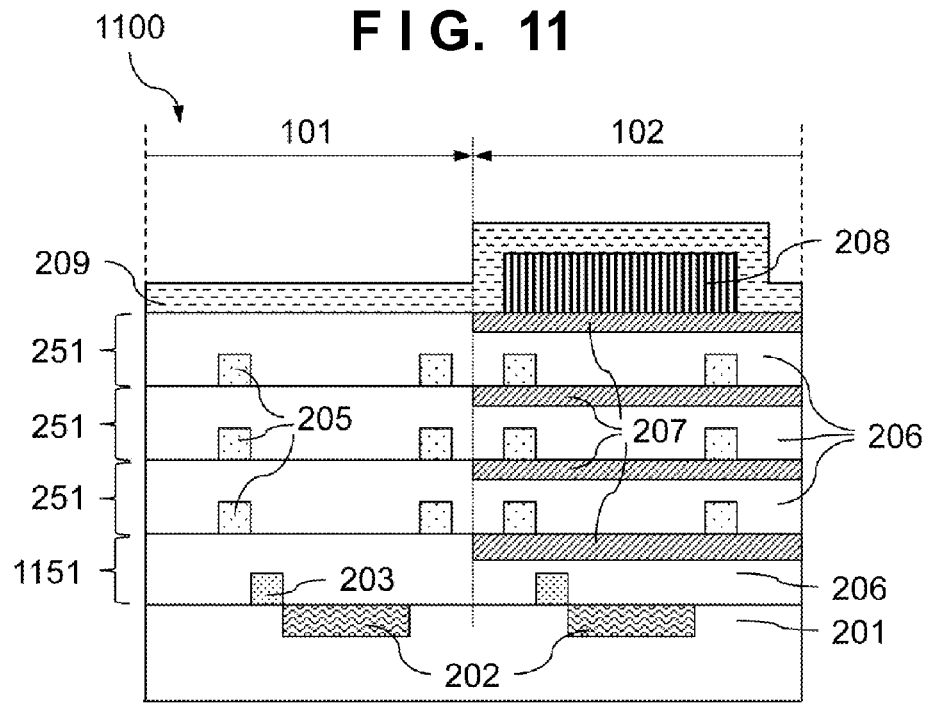
FIG. 11 is a cross-sectional view of a solid state image sensor according to an embodiment of the present invention.

With reference to FIGS. 11 and 12A to 12E, the following describes a configuration and a method for manufacturing of a solid state image sensor 1100 according to a seventh embodiment of the present invention. A plan view of the solid state image sensor 1100 may be the same as the plan view of the solid state image sensor 100 shown in FIG. 1. FIG. 11 is a cross-sectional view along the dashed line A-A' in FIG. 1, which schematically shows an example of the configuration of the solid state image sensor 1100. The solid state image sensor 1100 is different from the solid state image sensor 100 in having interlayer insulation films 1151 instead of the interlayer insulation films 204, and may be the same in other points. Considering this, the following description focuses on the configuration and the manufacturing processes of the interlayer insulation films 1151, and the same constituent elements as in the solid state image sensor 100 are not described redundantly.

In the present embodiment, an interlayer insulation film 1151 is formed on the gate electrodes 203. The interlayer insulation film 1151 includes an insulating layer 206 and an insulating layer 207. The insulating layers 206 are arranged above both the effective pixel region 101 and the optical black pixel region 102. Meanwhile, the insulating layers 207 are arranged only above the optical black pixel region 102, and are not arranged above the effective pixel region 101. As a result, each interlayer insulation film 1151 has a single-layer configuration composed of the insulating layer 206 above the effective pixel region 101, and has a multi-layer configuration composed of the insulating layer 206 and the insulating layer 207 above the optical black pixel region 102. In the present embodiment, the insulating layers 207 are respectively located on the insulating layers 206.

Next, with reference to FIGS. 12A to 12E, a description is given of a method for manufacturing the solid state image sensor 1100 according to the present embodiment described above. As shown in FIG. 12A, the pixel regions, namely the effective pixel region 101 and the optical black pixel region 102, are formed on the semiconductor substrate 201, and furthermore the gate electrodes 203 are formed. The insulating layer 206 is formed on these pixel regions, by CVD for example. A silicon oxide film is used as the insulating layer 206, for example.

Next, as shown in FIG. 12B, the upper surface of the insulating layer 206 is planarized by CMP or the like, because the upper surface of the insulating layer 206 is uneven due to the gate electrodes 203. Next, as shown in FIG. 12C, a mask pattern 1210 having an aperture above the optical black pixel region 102 is formed on the insulating layer 206. After that, the portion of the insulating layer 206 not covered with the mask pattern 1210 is etched by a dry etching for example. As shown in FIG. 12C, this etching may be ended before the upper surfaces of the gate electrodes 203 are exposed.

After that, the mask pattern 1210 is removed and the insulating layer 207 having a higher hydrogen concentration than the insulating layer 206 is formed on the insulating layer 206 as shown in FIG. 12D, by CVD, for example. A silicon oxide film is used as the insulating layer 207, for example. The insulating layer 207 is formed at a lower temperature than the insulating layer 206, and has a higher hydrogen concentration than the insulating layer 206.

After the insulating layer 207 is formed, the upper surface of the insulating layer 207 is planarized by CMP or the like so that the insulating layer 207 remains on the optical black pixel region 102 and the insulating layer 207 is removed from the surface of the effective pixel region 101 as shown in FIG. 12E. By these processes, the interlayer insulation film 1151 is formed so as to have the insulating layer 206 above the effective pixel region 101 and to have the insulating layer 206 and the insulating layer 207 above the optical black pixel region 102. After that, the wiring layers 205, the interlayer insulation films 251, the light shielding layer 208, and the protective film 209 are formed in the same manner as in the method for manufacturing the solid state image sensor 100, and then sintering is performed. By the processes above, each constituent element of the solid state image sensor 1100 shown in FIG. 11 is formed.

In the present embodiment, the hydrogen concentration of the insulating layers 207 is higher than the hydrogen concentration of the insulating layers 206. Of the interlayer insulation film 1151, the insulating layer 207 is formed only above the optical black pixel region 102. Therefore, of the interlayer insulation film 1151, the portion located above the optical black pixel region 102 has a higher hydrogen concentration than the portion located above the effective pixel region 101. Also, as described above, in the solid state image sensor 1100, the portion located above the optical black pixel region 102 and below the light shielding layer 208 has a higher hydrogen concentration than the portion located above the effective pixel region 101. Therefore, the method for manufacturing the solid state image sensor 1100 achieves the same advantageous effects as the method for manufacturing the solid state image sensor 100 described above.

The interlayer insulation film 204 of each of the solid state image sensors 400 and 600 may be replaced with the interlayer insulation film 1151. In this case, the wiring layers 205 may be embedded in the insulating layers 206 and 207 included in the interlayer insulation film 1151.

Although the present embodiment shows an example in which the interlayer insulation film 1151 has a single-layer configuration above the effective pixel region 101, and a double-layer configuration above the optical black pixel region 102, the present invention is not limited to such an embodiment. For example, the interlayer insulation film 1151 may be configured to have three or more layers above each of the regions.

Seven embodiments according to the present invention are described above. However, the present invention is not limited to the embodiments. For example, although the embodiments show examples in which each of the solid state image sensor has a triple-layer configuration of the interlayer insulation films 251, 451, 651, 851, 951, and 1051, these films may be configured to have one, two, or four or more layers. Also, a solid state image sensor may have a configuration which is stacked different interlayer insulation films. The configuration of each interlayer insulation film is determined according to need, for example depending on the layout of the wiring layers. Also, the configurations and shapes of the interlayer insulation films are only required to be determined such that hydrogen is uniformly supplied to at least the photodiodes 202 of the effective pixel region 101 and the optical black pixel region 102. For example, the insulating layers 207 having a higher hydrogen concentration than the insulating layer 206 may be formed to have a lattice shape. Also, for example, the insulating layers 207 may be located only at the positions to cover the photodiodes 202. The shapes of the insulating layers 206, the insulating layers 207, and the wiring layers 205 are determined according to factors such as their layouts or film thickness. Similarly, the shapes and film thicknesses of the copper anti-diffusion layers can be determined according to need as long as the diffusion of copper from the wiring layers 205 containing copper can be prevented, and hydrogen can be uniformly supplied to the photodiodes 202 of each of the effective pixel region 101 and the optical black pixel region 102. For example, the copper anti-diffusion layers may be formed along the wiring layers 205 so as to be located only above the wiring layers 205. In addition, the wiring layers 205 may serve as the light shielding layer 208. The embodiments described may be modified or combined with each other as needed.

The following describes a camera in which any of the solid state image sensors according to the above-described embodiments is mounted, as an application example of the solid state image sensors. The camera assumed here is not necessarily an apparatus used for mainly image capturing, but may be an apparatus that has an image capturing function as a secondary function (e.g. a personal computer, a portable terminal, etc.). The camera includes a solid state image sensor according to the present invention, which is exemplified above as an embodiment, and a signal processing unit that processes signals output from the solid state image sensor. The signal processor may include, for example, a processor for processing digital data based on the signals obtained from the solid state image sensor. An A/D converter for generating the digital data may be arranged on the semiconductor substrate of the solid state image sensor, or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-140000, filed Jul. 7, 2014 which is hereby incorporated by reference wherein in its entirety.

What is claimed is:

1. A method for manufacturing a solid state image sensor, the method comprising:
   forming an electrically conductive layer and an interlayer insulation film above a semiconductor substrate, the semiconductor substrate having a first region and a second region, photoelectric conversion elements being arranged in the first region and the second region;
   performing an annealing process after forming the conductive layer and the interlayer insulation film; and
   forming a protective film above the interlayer insulation film and the electrically conductive layer,
   wherein the electrically conductive layer includes a light shielding layer arranged above the second region,
   wherein the interlayer insulation film includes a first portion that is located above the first region and a second portion that is located above the second region and below the light shielding layer, and
   wherein, before performing the annealing process, the second portion of the interlayer insulation film has an average hydrogen concentration that is higher than an average hydrogen concentration of the first portion of the interlayer insulation film.

2. The method according to claim 1, wherein, before performing the annealing process, the second portion of the interlayer insulation film includes a first insulating layer and a second insulating layer that has a hydrogen concentration that is higher than a hydrogen concentration of the first insulating layer.

3. The method according to claim 2, wherein, before performing the annealing process, the second insulating layer has a hydrogen concentration that is higher than a hydrogen concentration of the first portion of the interlayer insulation film.

4. The method according to claim 1, wherein the electrically conductive layer includes a wiring layer containing copper, and
   wherein the interlayer insulation film includes a copper anti-diffusion layer located on the wiring layer containing copper.

5. The method according to claim 4, wherein the copper anti-diffusion layer includes a first copper anti-diffusion layer formed in the first portion and a second copper anti-diffusion layer formed in the second portion, and
   wherein before performing the annealing process, the second copper anti-diffusion layer has a hydrogen concentration that is higher than a hydrogen concentration of the first copper anti-diffusion layer.

6. The method according to claim 5, wherein the first portion of the interlayer insulation film includes the first copper anti-diffusion layer and a plurality of insulating layers including a third insulating layer, and
   wherein before performing the annealing process, the first portion of the interlayer insulation film has a hydrogen concentration that is equal to an average hydrogen concentration of the plurality of insulating layers.

7. The method according to claim 1, wherein the performing of the annealing process is conducted after the protective film is formed.

8. The method according to claim 1, wherein the electrically conductive layer includes a wiring layer and the light shielding layer, the wiring layer utilizing a metal.

9. The method according to claim 1, wherein the light shielding layer is formed as an uppermost layer of electrically conductive layers.

10. The method according to claim 1, wherein the solid state image sensor is of a CMOS type.

11. A solid state image sensor comprising:
   a semiconductor substrate having a first region and a second region, photoelectric conversion elements being arranged in the first region and the second region;
   an electrically conductive layer;
   an interlayer insulation film; and
   a protective film on the interlayer insulation film and the electrically conductive layer,
   wherein the electrically conductive layer includes a light shielding layer above the second region,
   wherein the interlayer insulation film includes a first portion that is located above the first region and a second portion that is located above the second region and below the light shielding layer,
   wherein each of the first portion of the interlayer insulation film and the second portion of the interlayer insulation film comprises an insulation layer,
   wherein the first portion and the second portion are different from each other in layer configuration, and
   wherein the first portion and the second portion are different from each other in average hydrogen concentration.

* * * * *